United States Patent

Guay et al.

Patent Number: 5,420,529
Date of Patent: May 30, 1995

[54] CURRENT STEERING SWITCH AND HYBRID BICMOS MULTIPLEXER WITH CMOS COMMUTATION SIGNAL AND CML/ECL DATA SIGNALS

[75] Inventors: Bernard Guay, Ottawa; Michael Altmann, Kanata, both of Canada

[73] Assignee: Northern Telecom Limited, Montreal, Canada

[21] Appl. No.: 246,207

[22] Filed: May 19, 1994

[51] Int. Cl.6 .......................................... H03K 19/094
[52] U.S. Cl. ........................................ 326/115; 326/66; 326/121; 327/408; 327/416
[58] Field of Search ................... 326/66, 73, 113, 114, 326/121, 115; 327/408, 410, 416

[56] References Cited

U.S. PATENT DOCUMENTS

| | | | |
|---|---|---|---|
| 4,684,829 | 8/1987 | Uratani | 307/449 |
| 4,725,742 | 2/1988 | Tachimori et al. | 307/449 |
| 5,039,883 | 8/1991 | On | 307/243 X |
| 5,149,992 | 9/1992 | Allstot et al. | 307/448 |
| 5,200,907 | 4/1993 | Tran | 307/448 X |
| 5,285,118 | 2/1994 | Montegari | 307/463 |

Primary Examiner—David R. Hudspeth
Attorney, Agent, or Firm—George MacGregor

[57] ABSTRACT

A current steering switch circuit responsive to a CMOS signal. In an specific embodiment the switch is incorporated in a hybrid BiCMOS multiplexer circuit using combined CMOS and CML/ECL signal types. The high speed CML/ECL logic signals are multiplexed under the control of a lower speed CMOS signal. A particular aspect of the circuit is that a CMOS to CML/ECL converter is not used. Additionally, a differential, logic commutation signal is not required.

10 Claims, 2 Drawing Sheets

CURRENT STEERING SWITCH AND HYBRID BICMOS MULTIPLEXER WITH CMOS COMMUTATION SIGNAL AND CML/ECL DATA SIGNALS

FIELD OF THE INVENTION

This invention relates to a current steering switch circuit, responsive to a CMOS signal, which can be used in both digital and analog circuits. In a preferred embodiment the steering circuit is used in a hybrid BiCMOS multiplexer in which high-speed CML/ECL logic signals are multiplexed under the control of a low-speed CMOS control signal.

BACKGROUND OF THE INVENTION

Current steering circuits based on a differential pair of bipolar or MOS transistors are well known. These circuits respond to differential inputs, that is, to the difference between two input signals. In the case where the control signal is inherently single-ended, such as with CMOS logic signals, additional circuitry is used to generate a complementary signal or to generate a reference level which must be applied to the second input of the differential pair. This increases the circuit complexity and power dissipation.

There is therefore a need for a current steering circuit which responds to a single-ended input signal without the need to generate a complementary signal or reference level. Such a circuit can be used in various applications such as Digital to Analog converters (DACs), Analog to Digital converters (ADCs), tunable analog circuits, and logic gates.

In an effort to reduce power dissipation and improve performance, the use of both CMOS and CML/ECL technology within the same integrated circuit is becoming commonplace. Consequently, in BiCMOS integrated circuits, the need arises for a CMOS signal to act as the control signal of a CML/ECL multiplexer. This is particularly true for a high-speed logic circuit having multiple modes of operation which are not to be commuted at high speed. Examples are a programmable divider and a scannable CML/ECL flip-flop for scan testing.

Typically, a CMOS to CML/ECL translator or a resistive network is required to translate the CMOS control signal to an CML/ECL format and a pure CML/ECL multiplexer circuit is used. This also results in higher complexity and power dissipation.

Thus, in BiCMOS circuits there is a need for a multiplexer circuit inherently responding to a CMOS control signal and operating on CML/ECL data signals.

In this application the term BiCMOS refers to the combination of bipolar and complementary MOS devices in the same circuit.

SUMMARY OF THE INVENTION

The basic circuit of the present invention uses a complementary MOS arrangement, together with a current source, to provide a current steering switch. As opposed to a differential pair, the circuit requires only a single input and does not need a complementary input or reference level. The current steering switch when incorporated into a multiplexer provides an arrangement which is particularly useful in applications where high speed CML/ECL logic signals need to be multiplexed under the control of a low-speed CMOS signal. Typical applications are high speed circuits having multiple modes of operation which do not need to be toggled at high speed. Another example is a scannable D-type flip-flop with a high speed data input and a low speed scan toggle signal.

Accordingly it is an object of the present invention to provide a current steering switch utilizing a complementary MOS arrangement.

It is a further object of the invention to provide a CMOS controlled current steering switch for use in a digital or analog circuit.

It is a further object of the present invention to provide a BiCMOS multiplexing circuit.

It is a still further object of this invention to provide a BiCMOS multiplexer having CML/ECL logic signals controlled by a CMOS signal.

It is yet a further object of the invention to provide a BiCMOS multiplexing circuit having CML/ECL logic signals controlled by a CMOS signal which need not be differential.

Therefore in accordance with a first aspect of the present invention there is provided a current switching circuit for steering current between a first and second path. The circuit comprises a substantially constant current source; an NMOS device connected between the current source and the first path and, a PMOS device between the current source and the second path. A logic signal is supplied to the gates of the CMOS devices, the value of the logic signal determining to which of the paths the current is steered.

In accordance with a second aspect of the invention there is provided a BiCMOS multiplexer circuit having a substantially constant current source connected to a negative supply. The circuit also includes complementary MOS devices, namely, an NMOS and a PMOS device each having a source, a drain and a gate, with the NMOS source and the PMOS drain connected to the current source. The gate of each is adapted to receive a CMOS input control signal. First and second differential pairs are also provided. Each pair has first and second bipolar transistors each having a collector, an emitter and a base. The emitters of each transistor in the first pair are commonly connected to the drain of one of the complementary MOS devices and the emitters of the second pair are commonly connected to the source of the other MOS device. The base of each transistor in the two pairs is adapted to receive CML/ECL input data. The collector of the first transistor in the first pair is connected to the collector of the first transistor in the second pair while the collector of the second transistor in the first pair is connected to the collector of the second transistor in the second differential pair. The collectors of each of the first and second transistors are connected to a positive supply through first and second load resistors. Output means, preferably in the form of emitter followers are connected across each load resistor. The circuit provides multiplexed CML/ECL data signals which are controlled by the CMOS input signal.

DETAILED DESCRIPTION

Figure 1:
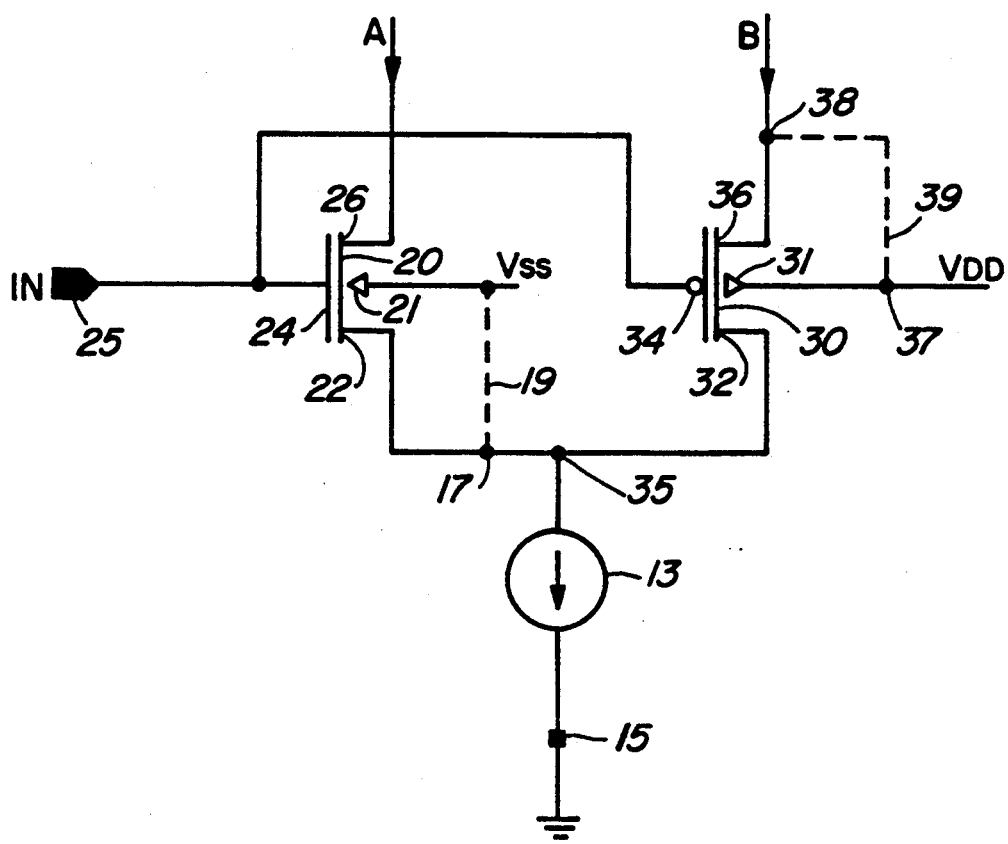
FIG. 1 is a schematic diagram of the basic current switching circuit.

Referring initially to FIG. 1, the basic switching circuit of the present invention comprises complementary MOS devices namely NMOS 20 and PMOS 30, and current source 13. The current source 13 is connected to negative supply 15 which may be grounded as illustrated in FIG. 1. The source 22 of NMOS 20 is connected to current source 13 and the drain 32 of PMOS 30 is connected to the current source 13. The drain 26 of NMOS 20 is connected to a first path A and the source 36 of PMOS 30 is connected to a second path B. Gate 24 of NMOS 20 and gate 34 of PMOS 30 are connected to input terminal 25. Substrate 31 of PMOS device 30 may be connected to node 38 as shown by the broken line 39 in FIG. 1 or it may be connected directly to VDD. Similarly, substrate 21 of NMOS device 20 may be connected to node 17 as shown by broken line 19, or it may be connected directly to VSS. The alternative connections shown in broken line in FIG. 1 may be used when the MOS technology allows. The exact configuration chosen is not material to the scope of the invention.

In operation, the circuit responds to a logic control signal at terminal 25 to steer the current in either branch A or branch B, depending on the value of the input signal. If the input voltage is low, NMOS device 20 is "off". Conversely, if the input voltage is high, PMOS device 30 is "off". Thus, providing the voltage at node 35 is within the range of the current source 13, the current in branch A or Branch B, depending on whether NMOS 20 or PMOS 30 is "on", will correspond to the current sourced by current source 13. The region of operation of the complementary MOS devices in the "on" state will be determined by the circuit attached to branch A and branch B.

Figure 2:
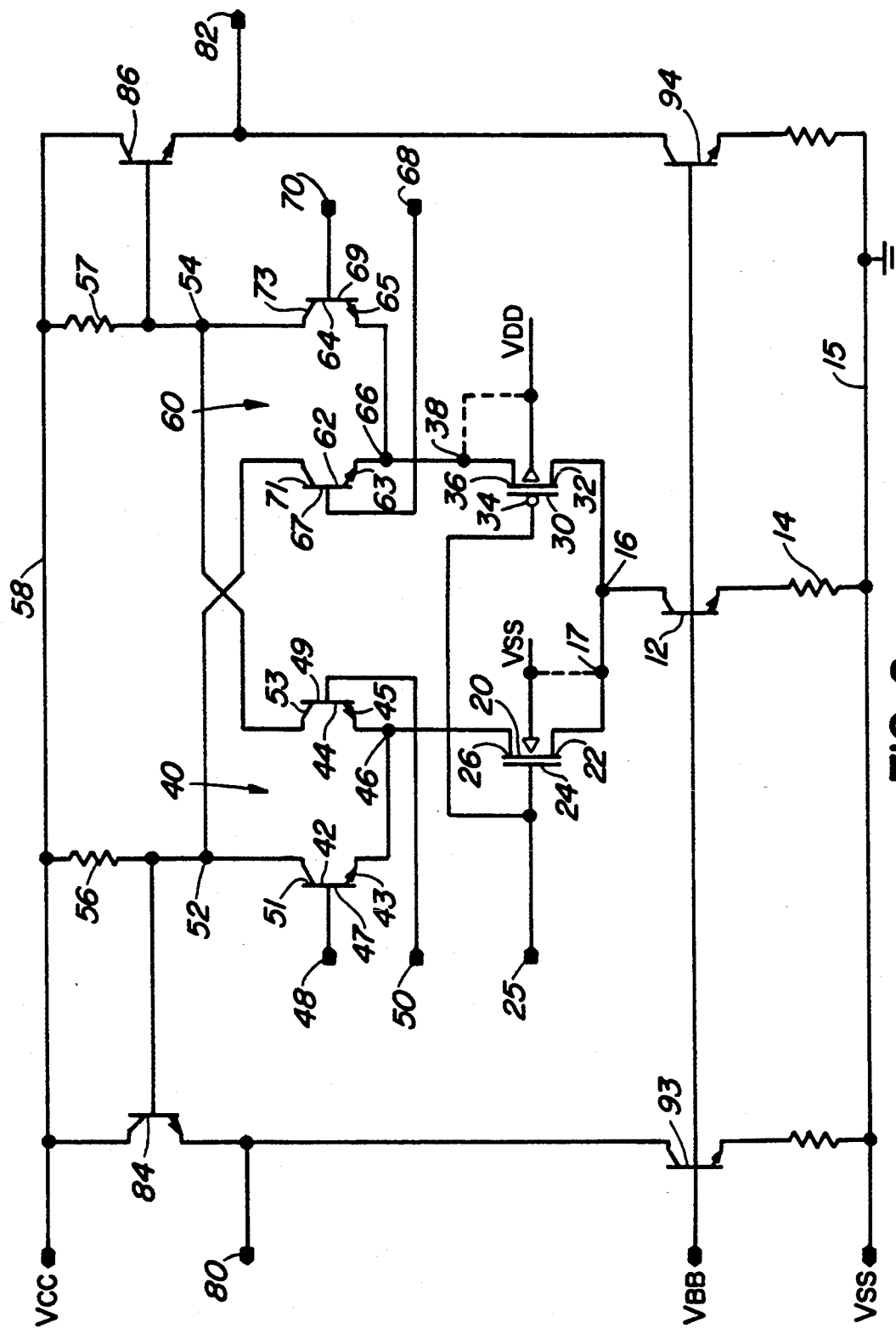
FIG. 2 is a schematic diagram of a multiplexer circuit incorporating the switching circuit of FIG. 1.

In FIG. 2, the current steering switch circuit of FIG. 1 is used in a hybrid multiplexer. As shown in FIG. 2, a constant current source comprising transistor 12 and resistor 14 is connected to node 16 on the common connection between the source 22 of NMOS device 20 and the drain 32 of PMOS device 30. It is to be understood that the current source 12,14 may alternatively consist of just one transistor or any other current source circuits as will be apparent to one skilled in the art. As shown in FIG. 2, gate 24 of NMOS device 20 and gate 34 of PMOS device 30 are connected to input terminal 25 to which is provided a CMOS input control signal. The drain 26 of NMOS device 20 is connected to first differential pair 40 and the source 36 of PMOS device 30 is connected to the second differential pair 60. The substrate 37 of PMOS device 30 may be connected to VDD or node 38 as shown in broken line in FIG. 2. Similarly substrate 39 of NMOS device 20 may be connected to VSS or node 17 also shown in broken line in FIG. 2.

The current source 12,14 is connected to the negative supply rail 15 which may, as shown, be tied to ground, although this is not essential.

First differential pair 40 includes bipolar transistors 42 and 44. The emitters 43,45 respectively are connected to node 46 which in turn is connected to drain 26 of NMOS device 20. The base 47 of transistor 42 is connected to data input terminal 48 and the base 49 of transistor 44 is connected to data input terminal 50. Differential logic signals are provided to input terminals 48 and 50.

The collector 51 of transistor 42 is connected to node 52 and the collector 53 of transistor 44 is connected to node 54. Load resistor 56 is connected between node 52 and the positive supply rail 58. Load resistor 57 is connected between node 54 and the positive supply rail 58.

Second differential pair 60 includes bipolar transistors 62 and 64. The emitters 63,65 respectively are connected to node 66 which in turn is connected to source 36 of PMOS device 30. The base 67 of transistor 62 is connected to data input terminal 68 and the base 69 of transistor 64 is connected to input terminal 70. As in relation to differential pair 40, differential logic signals are provided to input terminals 68 and 70. Collector 71 of transistor 62 is connected to node 52 and collector 73 of transistor 64 is connected to node 54. Hence, the collector 51 of the first transistor 42 in the first differential pair 40 is connected to the collector 71 of the first transistor 62 of the second differential pair 60. Similarly the collector 53 of second transistor 44 of first differential pair 40 is connected to the collector 73 of second transistor 64 of second differential pair 60.

Multiplexed output data signals appear at output terminals 80 and 82. The data signal at 80 is generated by emitter follower 84 across load resistor 56. The data signal at 82 is taken from emitter follower 86 across load resistor 57. It is to be understood, however, that the emitter follower is not essential and other means of developing the output signal will be apparent to those skilled in the art.

In operation, bias voltage VBB supplied by a bias supply (not shown) enables transistors 93,12 and 94. A CMOS control signal at terminal 25 turns on either MOS device depending on the logic level of the control signal. Thus, a high input signal at terminal 25 turns on NMOS 20 and turns off PMOS 30. This enables the first differential pair 40 while ensuring that second differential pair 60 remain in an 'off' state. A data signal appearing at input 48 turns on transistor 42 via gate 47 and the output appearing at node 52 is transferred via emitter follower 84, to output terminal 80.

A data signal at input 50 turns on transistor 44, which output appears at node 54. As discussed previously the signal at node 54 is transferred to terminal 82.

A logic low signal at CMOS control input 25 turns off NMOS 20 and turns on PMOS 30. This has the effect of enabling the second differential pair 60 and disabling first differential pair 40. As a consequence the second differential pair, during this portion of the CMOS control signal, is responsive to CML/ECL data signals at terminals 68 and 70. A data signal at terminal 68 turns on transistor 62 and the output is translated to output 80. Similarly, a data signal at terminal 70 turns on transistor 64 and the output is transferred to output terminal 82.

The complementary MOS devices are selected so that their drain to source voltage in the "on" state is small enough to keep the current source transistor(s) in their high impedance region.

It is important to note that the MOS parasitics of the present circuit do not affect the high speed operation of the CML/ECL signal paths in a digital application. In an analog application, the high frequency common mode rejection is reduced by the added capacitance at the emitters of the differential pairs and at the collectors of the current source transistor(s).

While a specific embodiment of the invention has been illustrated and described it will be obvious to one skilled in the art that variations and alternatives can be made to the invention. Such variations and alternatives, however, are understood to come within the scope of the invention as defined by the appended claims.

We claim:

1. A current switching circuit for steering current between a first or second path, said switching circuit comprising:
   a substantially constant current source;
   an NMOS device having a source, a drain and a gate, said NMOS source connected to said current source, said NMOS drain connected to said first path and said NMOS gate connected to a control input; and
   a PMOS device having a source, a drain and a gate, said PMOS drain connected to said current source, said PMOS source connected to said second path and said PMOS gate connected to said control input;
   whereby a logic high at said control input steers current to said first path and a logic low at said control input steers current to said second path.

2. The switching circuit as defined in claim 1, said substantially constant current source being connected to a negative supply.

3. The switching circuit as defined in claim 2, said negative supply being at ground potential.

4. The switching circuit as defined in claim 1, adapted to selectively steer current to a multiplexer.

5. A BiCMOS multiplexing circuit comprising:
   a substantially constant current source connected to a negative supply;
   complementary MOS devices comprising an NMOS and a PMOS, each having a drain, a source and a gate, each of said gates adapted to receive an input control signal and said NMOS source and said PMOS drain connected to said current source;
   first and second differential pairs, each comprising first and second bipolar transistors, each having an emitter, a collector and a base, said emitters of said first bipolar transistors being commonly connected to the drain of said NMOS device, said emitters of said second bipolar transistors being commonly connected to the source of said PMOS device, said base of each of said first and second transistors in each of said first and second differential pairs being adapted to receive CML/ECL input data, said collector of said first transistor in said first differential pair connected to said collector of said first transistor in said second differential pair and said collector of said second transistor in said first differential pair connected to said collector of said second transistor in said second differential pair;
   first and second load resistors, said first load resistor connected between said collector of said first transistor of said first and second differential pairs and a positive supply, and said second load resistor connected between said collector of said second transistor of said first and second differential pairs and said positive supply; and
   output means across said load resistor to provide multiplexed data output signals.

6. A BiCMOS multiplexing circuit as defined in claim 5, said substantially constant current source comprising a third bipolar transistor and a resistor.

7. A BiCMOS multiplexing circuit as defined in claim 5, said substantially constant current source comprising a bipolar transistor having an emitter, a collector and a base, said collector being connected to the commonly connected sources of said complementary MOS devices.

8. A BiCMOS multiplexing circuit as defined in claim 5, said substantially constant current source comprising third and fourth bipolar transistors, each having an emitter, a base and a collector, said collector of said third transistor being connected to the source of one of said complementary MOS devices, and said collector of said fourth transistor being connected to the source of the other of said complementary MOS devices.

9. A BiCMOS multiplexing circuit as defined in claim 5, said output means comprising an output bipolar transistor connected as an emitter follower.

10. A BiCMOS multiplexing circuit as defined in claim 8, the drain to source voltage on the complementary MOS devices is such that said third and fourth bipolar transistors are maintained in an active region.

* * * * *